US011127761B2

United States Patent
Zhao

(10) Patent No.: US 11,127,761 B2
(45) Date of Patent: Sep. 21, 2021

(54) TFT ARRAY SUBSTRATE AND DISPLAY PANEL WHERE THE SECOND METALLIC LAYER IS WITHDRAWN FOR A DISTANCE TO PREVENT PROBLEMS SUCH AS BROKEN FILM AND OXIDIZATION

(71) Applicant: SHENZHEN CHINA STAR OPTOELECTRONICS TECHNOLOGY CO., LTD., Guangdong (CN)

(72) Inventor: Yang Zhao, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 354 days.

(21) Appl. No.: 16/096,812

(22) PCT Filed: Aug. 31, 2018

(86) PCT No.: PCT/CN2018/103476
§ 371 (c)(1),
(2) Date: Oct. 26, 2018

(87) PCT Pub. No.: WO2019/227741
PCT Pub. Date: Dec. 5, 2019

(65) Prior Publication Data
US 2020/0365622 A1 Nov. 19, 2020

(30) Foreign Application Priority Data
May 29, 2018 (CN) .......................... 201810528473.7

(51) Int. Cl.
*H01L 27/12* (2006.01)

(52) U.S. Cl.
CPC ...... *H01L 27/1222* (2013.01); *H01L 27/1251* (2013.01)

(58) Field of Classification Search
None
See application file for complete search history.

(56) References Cited

U.S. PATENT DOCUMENTS

| 6,020,224 A * | 2/2000 | Shimogaichi ..... H01L 29/66765 438/158 |
| 2013/0075766 A1* | 3/2013 | Chang ............... G02F 1/136286 257/88 |

(Continued)

FOREIGN PATENT DOCUMENTS

| CN | 104576657 A | 4/2015 |
| CN | 105470269 A | 4/2016 |
| CN | 206020894 U | 3/2017 |

OTHER PUBLICATIONS

International Search Report issued in corresponding International Application No. PCT/CN2018/103476 dated Mar. 6, 2019, pp. 1-9, Chinese Patent Office, Beijing, China.

*Primary Examiner* — Bilkis Jahan
(74) *Attorney, Agent, or Firm* — Leong C. Lei

(57) ABSTRACT

The present invention teaches a TFT array substrate, including a substrate; a first metallic layer disposed on the substrate; a gate insulation layer disposed on the first metallic layer and the substrate, where the gate insulation layer includes a level section above the first metallic layer and a pair of step sections respectively connected to lateral sides of the level section; a second metallic layer disposed on the level section, where an area of the second metallic layer's vertical projection onto the top side of the substrate is smaller than an area of the level section's top side; and a protection layer disposed on the second metallic layer and the gate insulation layer. As the second metallic layer is (Continued)

withdrawn for a distance from the level section's circumference, the protection layer is not required to rise continuously, and the protection layer is less prone to broken film and oxidization.

11 Claims, 2 Drawing Sheets

(56) References Cited

U.S. PATENT DOCUMENTS

| | | | |
|---|---|---|---|
| 2014/0110719 A1* | 4/2014 | Sun | H01L 27/124 257/72 |
| 2015/0034956 A1 | 2/2015 | Woo et al. | |
| 2016/0027802 A1 | 1/2016 | Ahn et al. | |
| 2016/0148986 A1* | 5/2016 | Lee | H01L 29/78696 345/694 |

* cited by examiner

TFT ARRAY SUBSTRATE AND DISPLAY PANEL WHERE THE SECOND METALLIC LAYER IS WITHDRAWN FOR A DISTANCE TO PREVENT PROBLEMS SUCH AS BROKEN FILM AND OXIDIZATION

CROSS-REFERENCE TO RELATED APPLICATIONS

This application is a National Phase of International Application Number PCT/CN2018/103476, filed Aug. 31, 2018, and claims priority to Chinese Patent Application No. 201810528473.7, filed on May 29, 2018, the disclosure of which is incorporated herein by reference in its entirety.

FIELD OF THE INVENTION

The present invention is generally related to the field of display technology, and more particularly to a thin film transistor (TFT) array substrate and a related display panel.

BACKGROUND OF THE INVENTION

In manufacturing TFT array substrate, usually the corresponding sides of the first and second metallic layers are aligned so that level sections of the second metallic layer and the gate insulation layer have generally equal widths. When forming the protection layer, the protection layer having a thickness of mere 2000 Å has to climb the first metallic layer, the gate insulation layer, and the second metallic layer for a height about 10000 Å. As the corresponding sides of the first and second metallic layers are aligned, the protection layer has to climb continuously without buffer. The protection layer as such may be broken at where the gate insulation layer and the second metallic layer interface, thereby causing problems such as oxidization. Currently, these problems are not yet properly addressed.

SUMMARY OF THE INVENTION

Therefore, to obviate the shortcomings of the prior art, the present invention teaches a TFT array substrate and a display panel, where the second metallic layer is withdrawn for a distance so as to enlarge the distance between the second metallic layer and the gate insulation layer, to provide a buffer to the protection layer, and to prevent problems such as broken film and oxidization.

The present invention first teaches a TFT array substrate, comprising
a substrate;
a first metallic layer disposed on the substrate;
a gate insulation layer disposed on the first metallic layer and on portions of a top side of the substrate not covered by the first metallic layer, where the gate insulation layer comprises a level section above the first metallic layer and a pair of step sections respectively connected to lateral sides of the level section;
a second metallic layer disposed on the level section, where an area of the second metallic layer's vertical projection onto the top side of the substrate is smaller than an area of the level section's top side; and
a protection layer disposed on the second metallic layer and the gate insulation layer.

For the TFT array substrate of the present invention, the area of the second metallic layer's vertical projection onto the top side of the substrate is also the area of the vertical projection of a bottom side of the second metallic layer interfacing with the level section. As the second metallic layer's vertical projection onto the top side of the substrate has a smaller area than that of the level section's top side, this implies that a circumferential side or two opposite circumferential sides of the second metallic layer are located more adjacent to the level section's center. In other words, the second metallic layer is withdrawn for a distance from the level section's circumference, and a step is formed between the second metallic layer and the level section of the gate insulation layer. As such, when manufacturing the protection layer, the protection layer is not required to rise continuously. Instead, the rise of the protection layer is separated into two stages, and a buffer at the step is provided to the protection layer. Therefore, the protection layer is less prone to problems like broken film and oxidization, and the reliability of the TFT array substrate is significantly enhanced.

Two opposite circumferential sides of the second metallic layer is withdrawn for a preset distance towards a center of the level section.

The preset distance is 0.5-1 μm.

Two opposite circumferential sides of the first metallic layer are first slant sides; each step section comprises a second slant side connecting the level section; two opposite circumferential sides of the second metallic layer are third slant sides; and the first, second, and third slant sides are inwardly slant structure and have 40-60° included angles with the top side of the substrate.

The gate insulation layer has a first ditch; and the second metallic layer has a portion contacting the first metallic layer through the first ditch.

The second metallic layer has a second ditch whose vertical projection towards the top side of the substrate is within the first ditch's vertical projection towards the top side of the substrate.

The second metallic layers vertical projection towards the top side of the substrate has an area smaller than that of the top side of the level section.

Each of the first and second metallic layers is made of one or more of copper, tungsten, chromium, and aluminum.

The gate insulation layer is made of silicon oxide, silicon nitride, silicon oxynitride, or aluminum oxide; and the protection layer is made of silicon oxide or silicon nitride.

The present invention also teaches a display panel which includes a TFT array substrate described above.

The display panel taught by the present invention has significantly enhanced reliability due to that the protection layer of the TFT array substrate is less prone to broken film and oxidization problems.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Below are embodiments of the present invention, which does not limit the scope of the present invention. Any equivalent amendments within the spirit and principles of the embodiment described below should be covered by the protected scope of the invention.

Figure 1:
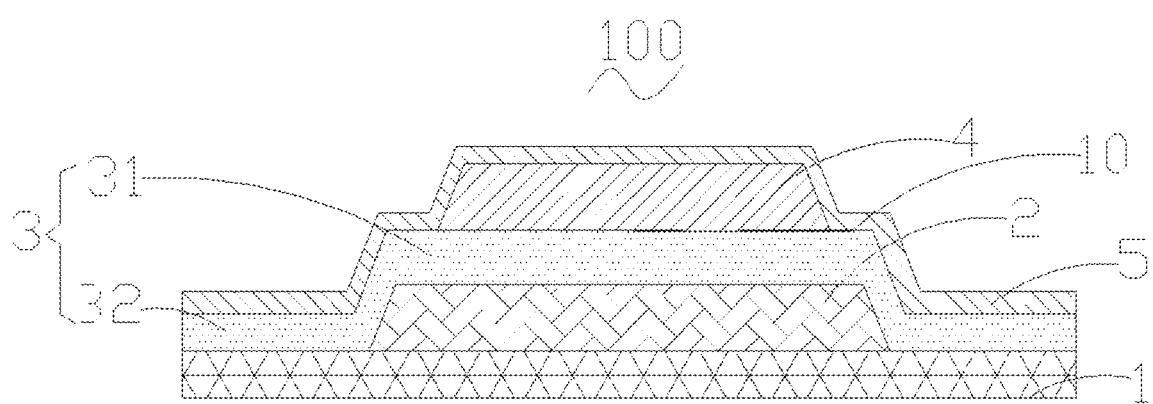
FIG. 1 is a structural schematic diagram showing a TFT array substrate according to an embodiment of the present invention.
Figure 2:
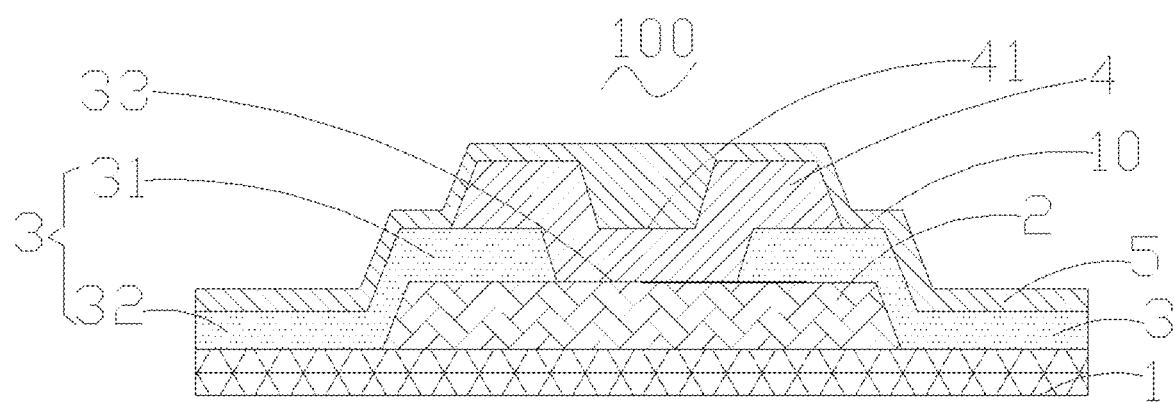
FIG. 2 is a structural schematic diagram showing a TFT array substrate according to another embodiment of the present invention.

The present invention teaches a TFT array substrate 100, as shown in FIG. 1, including:

a substrate 1;

a first metallic layer 2 disposed on the substrate 1;

a gate insulation layer 3 disposed on the first metallic layer 2 and on portions of a top side of the substrate 1 not covered by the first metallic layer 2, where the gate insulation layer 3 includes a level section 31 above the first metallic layer 2 and a pair of step sections 32 respectively connected to lateral ends of the level section 31;

a second metallic layer 4 disposed on the level section 31 where the area of the second metallic layer 4's projection onto the top side of the substrate 1 is smaller than the area of the level section 31's top side; and a protection layer 5 disposed on the second metallic layer 4 and the gate insulation layer 3.

For the TFT array substrate 100 of the present embodiment, the area of the second metallic layer 4's projection onto the top side of the substrate 1 is also the area of a bottom side of the second metallic layer 4 interfacing with the level section 31. As the second metallic layer 4's projection onto the top side of the substrate 1 has a smaller area than that of the level section 31's top side, this implies that a circumferential side or two opposite circumferential sides of the second metallic layer 4 are located more adjacent to the level section 31's center. In other words, the second metallic layer 4 is withdrawn for a distance from the level section 31's circumference, and a step is formed between the second metallic layer 4 and the level section 31 of the gate insulation layer 3. As such, when manufacturing the protection layer 5, the protection layer 5 is not required to rise continuously across several layers. Instead, the rise of the protection layer 5 is separated into two stages, and a buffer at the step is provided to the protection layer 5. Therefore, the protection layer 5 is less prone to problems like broken film and oxidization, and the reliability of the TFT array substrate 100 is significantly enhanced.

In the present embodiment, two opposite circumferential sides of the second metallic layer 4 is withdrawn for a preset distance away from the circumference and toward a center of the level section 31, thereby forming steps between the level section 31 and the two opposite circumferential sides of the second metallic layer 4, and enhancing the reliability of the TFT array substrate 100.

In the present embodiment, the preset distance is 0.5-1 μm. If the preset width is less than 0.5 μm, there is not enough buffering to the protection layer 5, and broken film and oxidization are still possible. If the preset width is greater than 1pm, the second metallic layer 4 may be broken and the function of the TFT array substrate 100 is damaged. Preferably, the preset distance is 0.6-0.9 μm and, more preferably, 0.7-0.8 μm.

In the present embodiment, two opposite circumferential sides of the first metallic layer 2 are first slant sides. Each step section 32 includes a second slant side connecting the level section 31. Two opposite circumferential sides of the second metallic layer 4 are third slant sides. The first, second, and third slant sides are inwardly slant structure and have 40-60° included angles with the top side of the substrate 1. By lowering the included angles, the protection layer 5 climbs slopes of smaller inclination, which is advantageous to prevent the protection layer 5 from being broken and thereby oxidized. Preferably, the first, second, and third slant sides have 45-55° included angles with the top side of the substrate 1.

In an alternative embodiment, the gate insulation layer 3 has a first ditch 33 and the second metallic layer 4 has a portion contacting the first metallic layer 2 through the first ditch 33. The gate insulation layer 3's ditch allows the first and second metallic layers 2 and 4 connected together. This facilitates the subsequent layout. Preferably, the first ditch 33 is located in the gate insulation layer 3's center.

In this embodiment, the second metallic layer 4 has a second ditch 41 whose vertical projection towards the top side of the substrate 1 is within the vertical projection of the first ditch 33 towards the top side of the substrate 1. Preferably, the second ditch 41 is right above the first ditch 33. In the present embodiment, coating, masking, or etching techniques are applied so that the vertical projection of the second metallic layer 4 towards the top side of the substrate 1 has an area smaller than that of the top side of the level section 31.

In the above embodiments, the first and second metallic layers 2 and 4 are made of one or more of copper, tons, aluminum.

In the above embodiments, the first and second metallic layers 2 and 4 may be made of different materials or of an identical material.

In the above embodiments, the gate insulation layer 3 is made of silicon oxide, silicon nitride, silicon oxynitride, or aluminum oxide.

In the above embodiments, the protection layer 5 is made of silicon oxide or silicon nitride.

In the above embodiments, the active layer is made of indium gallium zinc oxide (IGZO).

The present invention also teaches a display panel which includes a TFT array substrate 100 described above.

The display panel taught by the present invention has significantly enhanced reliability due to that the protection layer 5 of the TFT array substrate 100 is less prone to broken film and oxidization problems.

Above are embodiments of the present invention, which does not limit the scope of the present invention. Any equivalent amendments within the spirit and principles of the embodiment described above should be covered by the protected scope of the invention.

What is claimed is:

1. A thin film transistor (TFT) array substrate, comprising:
    a substrate;
    a first metallic layer disposed on the substrate;
    a gate insulation layer disposed on the first metallic layer and on portions of a top side of the substrate not covered by the first metallic layer, where the gate insulation layer comprises a level section above the first metallic layer and a pair of step sections respectively connected to lateral sides of the level section;
    a second metallic layer disposed on the level section, where an area of the second metallic layer's vertical projection onto the top side of the substrate is smaller than an area of the level section's top side; and
    a protection layer disposed on the second metallic layer and the gate insulation layer;
    wherein two opposite circumferential sides of the second metallic layer is withdrawn for a preset distance towards a center of the level section;
    wherein the preset distance is 0.5-1 μm.

2. The TFT array substrate according to claim 1, wherein two opposite circumferential sides of the first metallic layer are first slant sides; each of the step sections comprises a second slant side connecting the level section; two opposite circumferential sides of the second metallic layer are third slant sides; and the first, second, and third slant sides are inwardly slant structure and have 40-60° included angles with the top side of the substrate.

3. The TFT array substrate according to claim 1, wherein the second metallic layer's vertical projection towards the top side of the substrate has an area smaller than that of the top side of the level section.

4. The TFT array substrate according to claim 1, wherein each of the first and second metallic layers is made of one or more of copper, tungsten, chromium, and aluminum.

5. The TFT array substrate according to claim 1, wherein the gate insulation layer is made of silicon oxide, silicon nitride, silicon oxynitride, or aluminum oxide; and the protection layer is made of silicon oxide or silicon nitride.

6. A display panel, comprising a TFT array substrate, wherein the TFT array substrate comprises:
   a substrate;
   a first metallic layer disposed on the substrate;
   a gate insulation layer disposed on the first metallic layer and on portions of a top side of the substrate not covered by the first metallic layer, where the gate insulation layer comprises a level section above the first metallic layer and a pair of step sections respectively connected to lateral sides of the level section;
   a second metallic layer disposed on the level section, where an area of the second metallic layer's vertical projection onto the top side of the substrate is smaller than an area of the level section's top side; and
   a protection layer disposed on the second metallic layer and the gate insulation layer;
   wherein two opposite circumferential sides of the second metallic layer is withdrawn for a preset distance towards a center of the level section;
   wherein the preset distance is 0.5-1 μm.

7. The display panel according to claim 6, wherein two opposite circumferential sides of the first metallic layer are first slant sides; each of the step sections comprises a second slant side connecting the level section; two opposite circumferential sides of the second metallic layer are third slant sides; and the first, second, and third slant sides are inwardly slant structure and have 40-60° included angles with the top side of the substrate.

8. The display panel according to claim 6, wherein the second metallic layer's vertical projection towards the top side of the substrate has an area smaller than that of the top side of the level section.

9. The display panel according to claim 6, wherein each of the first and second metallic layers is made of one or more of copper, tungsten, chromium, and aluminum.

10. The display panel according to claim 6, wherein the gate insulation layer is made of silicon oxide, silicon nitride, silicon oxynitride, or aluminum oxide.

11. The display panel according to claim 6, wherein the protection layer is made of silicon oxide or silicon nitride.

* * * * *